(12) United States Patent
Schell

(10) Patent No.: US 8,731,022 B2
(45) Date of Patent: May 20, 2014

(54) QUADRATURE MODULATION WITHOUT CARRIER

(71) Applicant: Ultrabit Communications LLC, Wilmington, DE (US)

(72) Inventor: Stephan V. Schell, San Mateo, CA (US)

(73) Assignee: Ultrabit Communications LLC, Wilmington, DE (US)

( * ) Notice: Subject to any disclaimer, the term of this patent is extended or adjusted under 35 U.S.C. 154(b) by 0 days.

(21) Appl. No.: 14/035,243

(22) Filed: Sep. 24, 2013

(65) Prior Publication Data

US 2014/0016673 A1    Jan. 16, 2014

Related U.S. Application Data

(60) Division of application No. 13/112,878, filed on May 20, 2011, now Pat. No. 8,553,806, which is a continuation of application No. 12/423,674, filed on Apr. 14, 2009, now Pat. No. 7,953,182, which is a continuation of application No. 10/306,419, filed on Nov. 27, 2002, now Pat. No. 7,532,682.

(51) Int. Cl.
*H04B 1/00* (2006.01)

(52) U.S. Cl.
USPC ............................. 375/130; 375/295; 375/302

(58) Field of Classification Search
USPC .......... 375/130, 256, 295, 298, 302; 332/106; 327/291
See application file for complete search history.

(56) References Cited

U.S. PATENT DOCUMENTS

| | | | |
|---|---|---|---|
| 4,340,875 A | 7/1982 | English | |
| 4,397,039 A | 8/1983 | McAuliffe | |
| 4,481,640 A | 11/1984 | Chow et al. | |
| 4,567,602 A | 1/1986 | Kato et al. | |
| 4,924,492 A | 5/1990 | Gitlin et al. | |
| 5,383,462 A | 1/1995 | Hall | |
| 5,504,455 A | 4/1996 | Inkol | |
| 5,822,363 A | 10/1998 | Le Roy | |
| 5,872,540 A | 2/1999 | Casabona et al. | |
| 5,872,815 A | 2/1999 | Strolls et al. | |
| 6,044,103 A | 3/2000 | Weaver | |
| 6,192,090 B1 * | 2/2001 | Lee | 375/346 |
| 7,532,682 B1 | 5/2009 | Schell | |
| 7,953,182 B2 | 5/2011 | Schell | |

OTHER PUBLICATIONS

Office Action, issued in U.S. Appl. No. 10/306,419, mailed Mar. 7, 2006, 14 pages.
Office Action, issued in U.S. Appl. No. 10/306,419, mailed Nov. 16, 2006, 13 pages.
Office Action, issued in U.S. Appl. No. 10/306,419, mailed Jul. 12, 2007, 5 pages.

(Continued)

*Primary Examiner* — Curtis Odom
(74) *Attorney, Agent, or Firm* — Schwabe, Williamson & Wyatt, P.C.

(57) ABSTRACT

Transmitters, receivers and associated methods are disclosed for providing phase and amplitude modulation in a carrier-less communication system (e.g., an ultra-wide band communication system). An approximate quadrature signal is provided by delaying the in-phase signal by an amount determined by various criteria, such as the bandwidths of the component signals, minimizing the mean square error between an approximate quadrature signal and the true quadrature signal, and minimizing the auto-correlation function of the in-phase signal.

19 Claims, 11 Drawing Sheets

(56) References Cited

OTHER PUBLICATIONS

Office Action, issued in U.S. Appl. No. 10/306,419, mailed Dec. 31, 2007, 5 pages.
Office Action, issued in U.S. Appl. No. 10/306,419, mailed Sep. 4, 2008, 4 pages.
Notice of Allowance, issued in U.S. Appl. No. 10/306,419, mailed Dec. 30, 2008, 8 pages.
Office Action, issued in U.S. Appl. No. 12/423,674, mailed May 25, 2010, 7 pages.
Notice of Allowance, issued in U.S. Appl. No. 12/423,674, mailed Jan. 21, 2011, 6 pages.
Office Action, issued in U.S. Appl. No. 12/423,674, mailed Nov. 18, 2010, 9 pages.
Restriction Requirement, issued in U.S. Appl. No. 13/112,878, mailed Dec. 19, 2012, 6 pages.
Office Action, issued in U.S. Appl. No. 13/112,878, mailed Mar. 4, 2013, 6 pages.
Notice of Allowance, issued in U.S. Appl. No. 13/112,878, mailed, Jun. 13, 2013, 8 pages.

\* cited by examiner

QUADRATURE MODULATION WITHOUT CARRIER

CROSS REFERENCE TO RELATED APPLICATIONS

The present application is a divisional of and claims priority under 35 U.S.C. §120 to U.S. application Ser. No. 13/112,878, entitled "QUADRATURE MODULATION WITHOUT CARRIER," filed on May 20, 2011, which in turn is a continuation of and claims priority under 35 U.S.C. §120 to U.S. application Ser. No. 12/423,674, entitled "QUADRATURE MODULATION WITHOUT CARRIER," filed on Apr. 14, 2009 and issued on May 31, 2011 as U.S. Pat. No. 7,953,182, which in turn is a continuation of and claims priority under 35 U.S.C. §120 to U.S. application Ser. No. 10/306,419, entitled "QUADRATURE MODULATION WITHOUT CARRIER," filed on Nov. 27, 2002 and issued on May 12, 2009 as U.S. Pat. No. 7,532,682. All of these prior applications are assigned to the same assignee as the present application and incorporated herein by reference in their entireties.

BACKGROUND OF THE INVENTION

1. Field of the Invention

The present invention relates to data communication. In particular, the present invention relates to a signal modulation method of high spectral efficiency suitable for use in data communication without requiring modulation of a carrier signal.

2. Discussion of the Relevant Art

Signal constellations needed for M-ary phase-shift key (PSK) modulations (M>2) and quadrature amplitude modulation (QAM) are not known in a carrier-less communication system, such as impulse radio and some ultra-wideband (UWB) systems. In M-ary PSK modulation and QAM, phase and amplitude (or signed amplitude) are both available for encoding data. Using both phase and amplitude increases spectral efficiency and data rate. For example, consider a binary PSK (BPSK) signal that uses only constellation points ±A, and a quaternary PSK (QPSK) signal that uses only constellation points ±A and ±jA, where j is $\sqrt{-1}$. The BPSK constellation points have phases of 0 and 180 degrees, and the QPSK constellation points have phases of 0, 180, and ±90 degrees. If the channel imposes an additive white Gaussian noise in the received signal, the BPSK and QPSK signals would both require the same signal-to-noise-ratio (SNR) per bit to achieve the same bit error rate (BER), even though the QPSK signal conveys twice as many bits over the same time duration and frequency bandwidth. Thus, the QPSK signal provides a higher spectral efficiency than a BPSK signal. An M-ary QAM signal has similar advantages over an M-ary PAM signal.

Exploiting both amplitude and phase of a signal requires generating both in-phase and quadrature signals at the transmitter. A quadrature signal is conventionally defined with respect to a modulated carrier signal that is 90 degrees out of phase (i.e., in quadrature) with a carrier used for the in-phase signal. In a conventional system, an explicit carrier signal at a prescribed frequency, together with mixing and frequency conversion techniques, can be used to generate in-phase and quadrature signals. However, neither a carrier signal, nor the signal mixing or frequency conversion techniques, is available in a carrier-less data communication system, such as UWB signals.

Similarly, an M-ary PSK modulation (M>2) phase-shifts a carrier. In a carrier-less system which, by definition, has no carrier to phase-shift, phase-shift keying is unknown in the prior art.

SUMMARY OF THE INVENTION

The present invention provides transmitters, receivers and associated methods that provide phase and amplitude modulations in a carrier-less communication system (e.g., impulse radio and ultra-wide band communication systems). According to one embodiment of the present invention, an approximate quadrature signal is provided by delaying the in-phase signal by an amount determined by various criteria, such as the bandwidths of the component signals, minimizing the mean square error between an approximate quadrature signal and the true quadrature signal, and minimizing the auto-correlation function of the in-phase signal. Having the phase and amplitude modulation increases spectral efficiency, while various selections of the delay value to provide the approximate quadrature signals also allows various system performance objectives to be accomplished, as discussed in the detailed description below.

According to one embodiment of the present invention, a method for providing phase and quadrature signals in a carrier-less communication system includes (a) providing an in-phase signal; (b) obtaining an approximate quadrature signal by applying a delay to the in-phase signal; and (c) summing the in-phase and the approximate quadrature signal.

In one implementation, the in-phase signal conforms to Rice's representation, and the bandwidths of the coefficients in the Rice's representation are substantially less than the center frequency in the Rice's representation. In one embodiment, a value of the delay is approximately $$\frac{1}{4f_c},$$

where $f_c$ is the center frequency in the Rice's representation.

In another implementation, the value of the delay for obtaining the approximate quadrature signal is selected by minimizing a cross-correlation function of an approximate quadrature signal to an in-phase signal and the true quadrature signal to the in-phase signal (e.g., the in-phase signal's Hilbert Transform). Alternatively, the value of the delay is selected by minimizing a magnitude of an auto-correlation function of the in-phase signal.

Alternatively, the present invention may be implemented by a filter having an impulse response given by a linear function of the Dirac delta function.

According to one embodiment of the present invention, a transmitter for a signal having phase and quadrature components in a carrier-less communication system includes: (a) a first signal path that generates an in-phase signal; (b) a second signal path that generates an approximate quadrature signal by applying a delay to the in-phase signal; (c) a summer that sums the in-phase and the approximate quadrature signal; and (d) a transmitter that transmits the summed signal of the summer. Such a transmitter can implement the various approximate quadrature signals discussed above, by appropriately designing the delay element in the second signal path.

Signals transmitted in accordance with the present invention can be received in receivers using matched-filter techniques.

The present invention is better understood upon consideration of the detailed description below and the accompanying drawings.

BRIEF DESCRIPTION OF THE DRAWINGS

FIG. 4 also provides the time domain and frequency domain representation 402a and 402b, respectively, of signal p(t) a high-pass filtered signal of signal g(t).

To facilitate cross-reference across figures and to simplify the detailed description below, like elements in multiple figures are assigned like reference numerals.

DETAILED DESCRIPTION OF THE PREFERRED EMBODIMENTS

Figure 1:
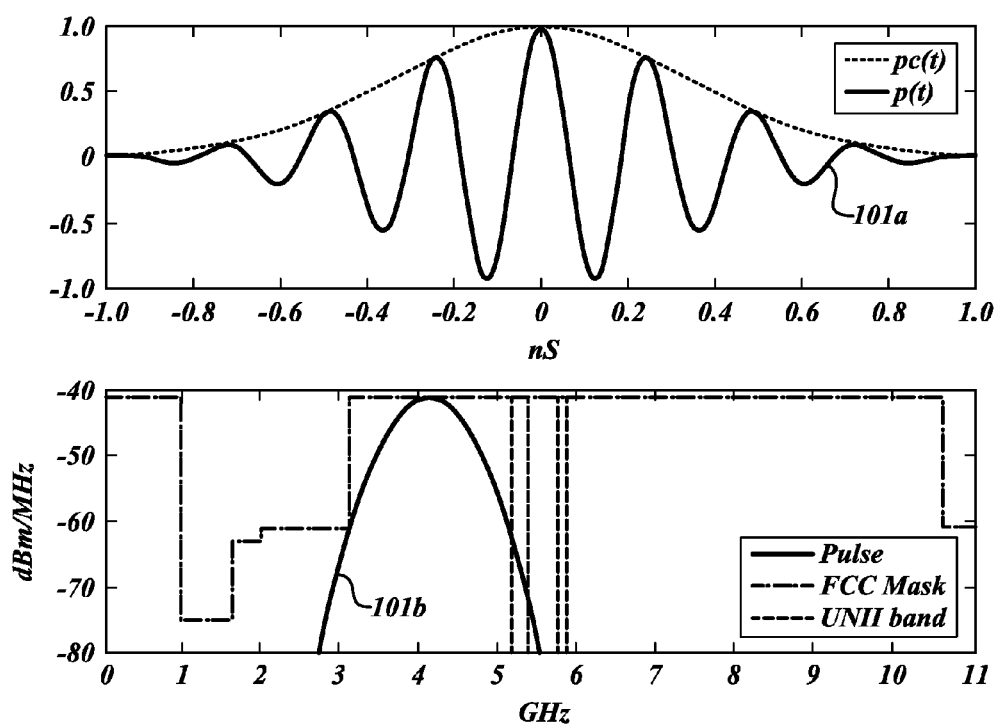
FIG. 1 shows the time and frequency domain representations 101a and 101b of a Gaussian signal p(t).

A carrier-less ultra-wide band (UWB) signal modulated by a M-ary phase-amplitude modulation (PAM) method (e.g., binary PAM, binary phase-shift key (BPSK), and biphase monocycles modulation schemes) can be represented as follows:

$$x(t) = \sum_n a_n p(t - nT)$$

where the M-ary symbol sequence $a_n$ is typically binary and takes on real values ±1, signal p(t) is the UWB pulse or impulse, and T is the center-to-center time period between pulses. The desired QAM signal y(t) can be represented by:

$$y(t) = \sum_n a_n p(t - nT) + \sum_n b_n q(t - nT)$$

where the M-ary symbol sequence $b_n$ takes on real values from the same set as $a_n$, but can be independent from $a_n$, and q(t) is the quadrature signal to in-phase signal p(t).

The present invention enables QAM signal y(t) to be generated without requiring a special pulse-shaping network to create quadrature signal q(t). Further, in a practical implementation, because matching two circuits of different types is generally more difficult than matching replicas of the same signal, generating quadrature signal q(t) from in-phase signal p(t) (e.g., by sending signal p(t) through another circuit) is preferred.

Recalling that Rice's representation for a band-pass signal p(t) is:

$$p(t)=p_c(t)\cos(2\pi f_c t)-p_s(t)\sin(2\pi f_c t)$$

where the solutions for $p_c(t)$, $p_s(t)$, and $f_c$ are non-unique, quadrature signal q(t) to in-phase signal p(t) can be provided by:

$$p(t)=p_c(t)\sin(2\pi f_c t)+p_s(t)\cos(2\pi f_c t)$$

Signals p(t) and q(t) are orthogonal by construction.

In some situations, Rice's representation may be problematic, thus motivating an alternative (but mathematically equivalent) expression for quadrature signal q(t):

$$q(t) = p(t) * \frac{1}{\pi t}$$

where * is the convolution operator. In this formulation, quadrature signal q(t) is the Hilbert transform of in-phase signal p(t).

As formulated under either Rice's representation or Hilbert transform, quadrature signal q(t), or even an approximation q̂(t) of signal q(t), is difficult to implement in practice. The present invention provides a method for constructing approximate quadrature signal q̂(t) by assuming, initially, that the bandwidths of signals $p_c(t)$ and $p_s(t)$ are sufficiently less than the center frequency $f_c$, so that the correlation widths of signals $p_c(t)$ and $p_s(t)$ greatly exceed the time needed to produce a 90-degree phase shift at $f_c$:

$$p_c(t-\tau) \approx p_c(t) \text{ and } p_s(t-\tau) \approx p_s(t)$$

where the value $\tau$ can be, for example, $$\tau = \frac{1}{4\pi f_c}.$$

Under this assumption, approximate quadrature signal $\hat{q}(t)$ can be provided by delaying in-phase signal $p(t)$:

$$\hat{q}(t) = p(t-\tau)$$

Such an approximation of a quadrature signal to an UWB pulse is believed counter-intuitive, because UWB pulses are typically thought of as having bandwidths that are too wide for this kind of narrowband approximations to apply.

Two embodiments of the present invention are illustrated below, by way of example.

First Example

In this first example, a UWB pulse signal $p(t)$ is provided in FIG. 1 as a Gaussian pulse having two-sided bandwidth of 2 GHz centered at 4.1 GHz:

$$p(t) = p_c(t)\cos(2\pi f_c t), \text{ where } p_c(t) = e^{\frac{-t^2}{2\sigma^2}}$$

with $f_c$=4.1 GHz and $\sigma$=342 pS. FIG. 1 shows the time and frequency domain representations of a Gaussian signal pulse $p(t)$. Thus, in this example, signal $p(t)$ matches exactly Rice's representation. Therefore, quadrature signal $q(t)$ is given by:

$$q(t) = p_c(t)\sin(2\pi f_c t)$$

According to the present invention, approximate quadrature signal $\hat{q}(t)$ can be provided by:

$$\hat{q}(t) = p(t-\tau) = p_c(t-\tau)\cos(2\pi f_c(t-\tau))$$

Figure 2:
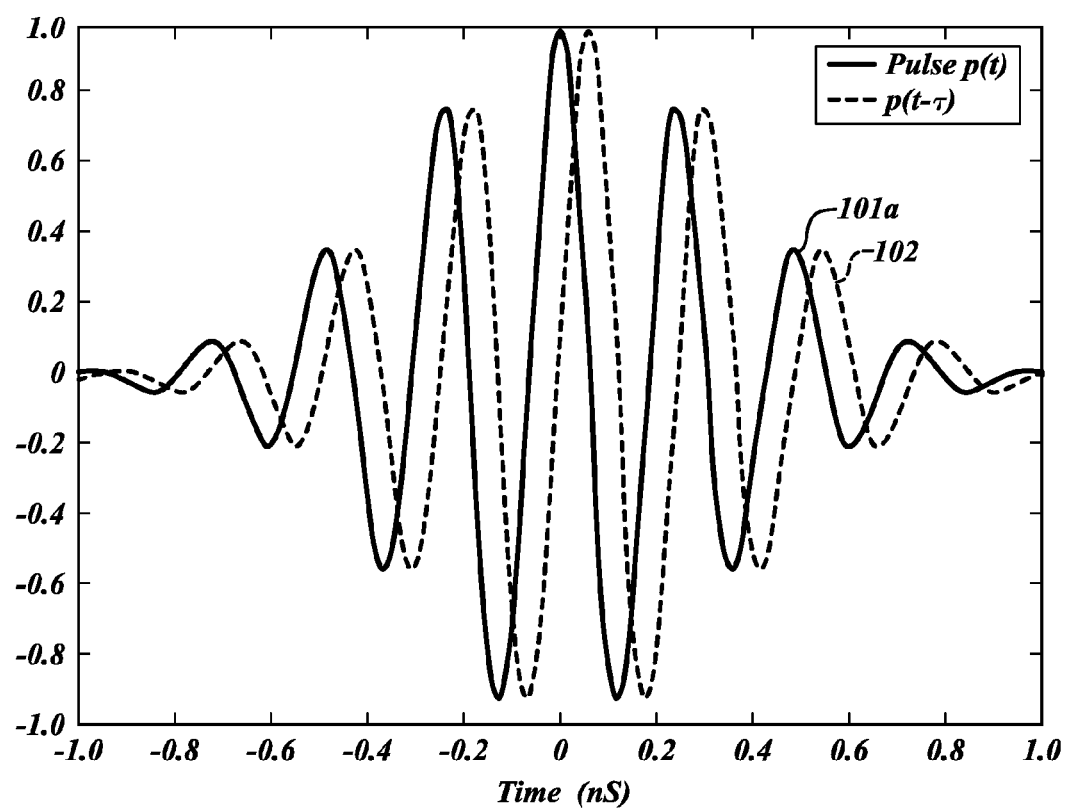
FIG. 2 shows in-phase signal p(t) of FIG. 1 (waveform 101a) and its delayed signal p(t−τ) (waveform 102), where $$\tau = \frac{1}{4f_c}.$$

In this example, a quarter-wavelength delay (i.e, $$\tau = \frac{1}{4 f_c},$$

which is approximately 61 pS) is used. FIG. 2 shows in-phase signal $p(t)$ (waveform 101a) of FIG. 1 and its delayed signal $p(t-\tau)$, (waveform 102), where $$\tau = \frac{1}{4 f_c}.$$

Figure 3:
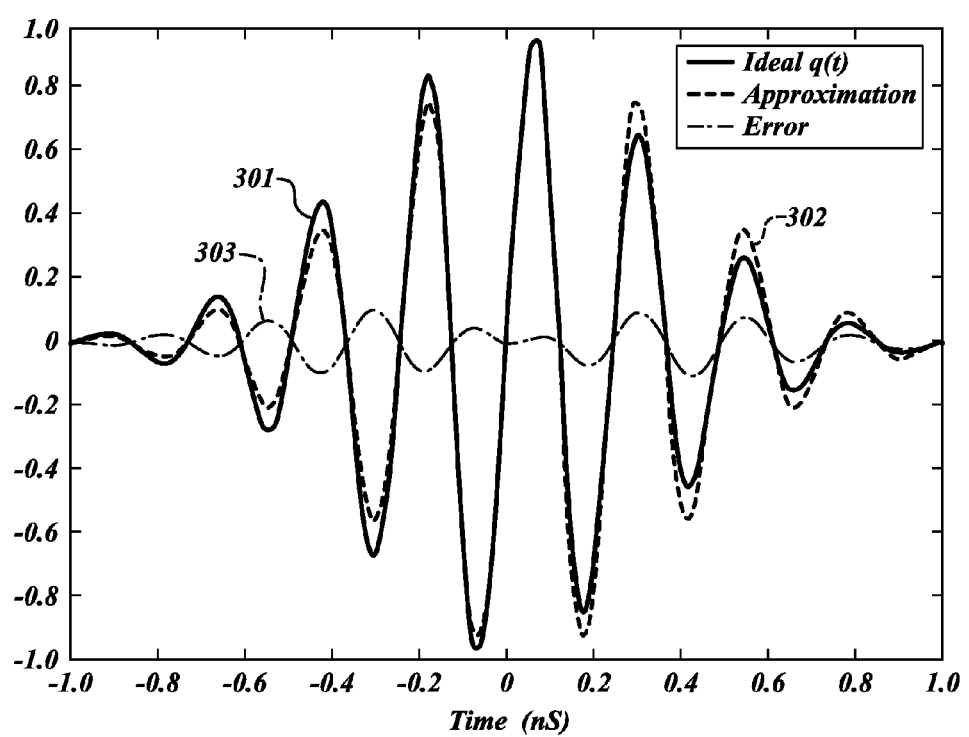
FIG. 3 compares quadrature signal q(t) (waveform 301) under Rice's representation for in-phase signal p(t) of FIG. 1 with approximate quadrature signal q̂(t) (waveform 302) according to the present invention.

FIG. 3 compares quadrature signal $q(t)$ (waveform 301) under Rice's representation for signal in-phase $p(t)$ of FIG. 1 with approximate quadrature signal $\hat{q}(t)$ (waveform 302), according to the present invention. As illustrated by waveform 303 of FIG. 3, the total squared error between waveform 301 (i.e., Rice's representation quadrature signal $q(t)$) and waveform 302 (i.e., signal $\hat{q}(t)$, approximation by $p(t-\tau)$) is −18 dB, relative to the pulse energy. Such a small error can be ignored in the presence of multipath and other practical system imperfections (i.e., noise).

Unlike this first example, in which in-phase signal $p(t)$ is selected to conform to Rice's representation, so that a reasonable choice of the delay $$\tau = \frac{1}{4 f_c}$$

is available from its characteristic center frequency $f_c$, other UWB signals that have been proposed do not conform to Rice's representation. As illustrated in the second example below, the present invention is also applicable to signals that do not conform to Rice's representation.

Second Example

Figure 4:
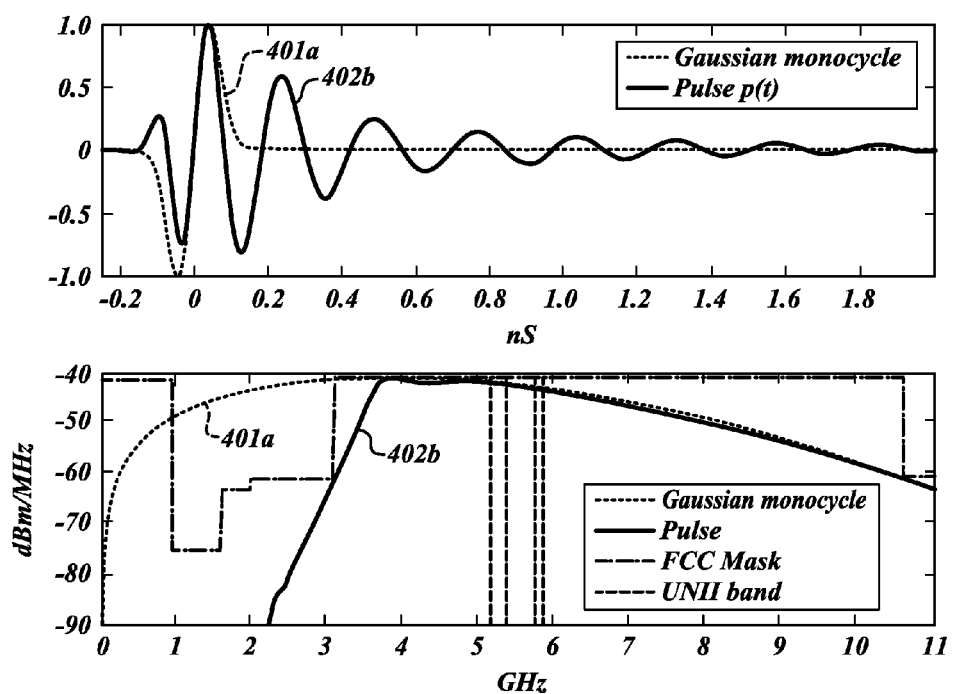
FIG. 4 shows the time domain and frequency domain representations 401a and 401b, respectively, of the Gaussian monocycle signal g(t) with a width parameter σ.

In this second example, a UWB signal pulse $p(t)$ is provided in FIG. 4 by a Gaussian "monocycle" signal $p(t)$ that has been high-pass filtered to become a pulse that is FCC compliant. FIG. 4 shows, in both time domain and frequency domain representations 401a and 401b, respectively, the Gaussian monocycle signal $g(t)$, which is given by $$g(t) = \frac{t}{\sigma} e^{\frac{1}{2} - \frac{t^2}{2\sigma^2}},$$

with a width parameter $\sigma$ selected to be 86 pS, for example. FIG. 4 also provides the time domain and frequency domain representations, waveforms 402a and 402b, respectively, of signal $p(t)$, which is a high-pass filtered signal of $g(t)$. Signal $p(t)$ can be used as a UWB pulse. As shown in FIG. 4, the high-pass filter signal (denoted $p(t)$) can be provided, for example, by a $6^{th}$ order Chebyshev type I filter with cutoff frequency 3.7 GHz and 1 dB of passband ripple. In this example, in-phase signal $g(t)$'s Hilbert transform provides quadrature signal $q(t)$.

According to the present invention, quadrature signal $q(t)$ is approximated by a delayed version of $p(t)$ (i.e., $q(t) \approx \hat{q}(t) = p(t-\tau)$). In this example, without a center frequency to suggest a value for the delay parameter $\tau$, the value of $\tau$ can be selected by one of many alternative procedures.

Cross-Correlation Procedure

The value of $\tau$ can be selected, for example, by minimizing the mean squared error between the quadrature pulse $q(t)$ and the approximation pulse $\hat{q}(t) = p(t-\tau)$. (In fact, this procedure for choosing the value of $\tau$ can be applied to any pulse $p(t)$, and not limited to the Gaussian monocycle signal in this example). Minimizing mean square error in this procedure is mathematically equivalent to the "cross-correlation procedure" of finding the value of $\tau$ that maximizes the magnitude of the cross-correlation function of quadrature signal $q(t)$ and approximate quadrature signal $p(t-\tau)$ to signal $p(t)$, given by:

$$\int q(t) p(t-\tau) dt$$

Figure 5:
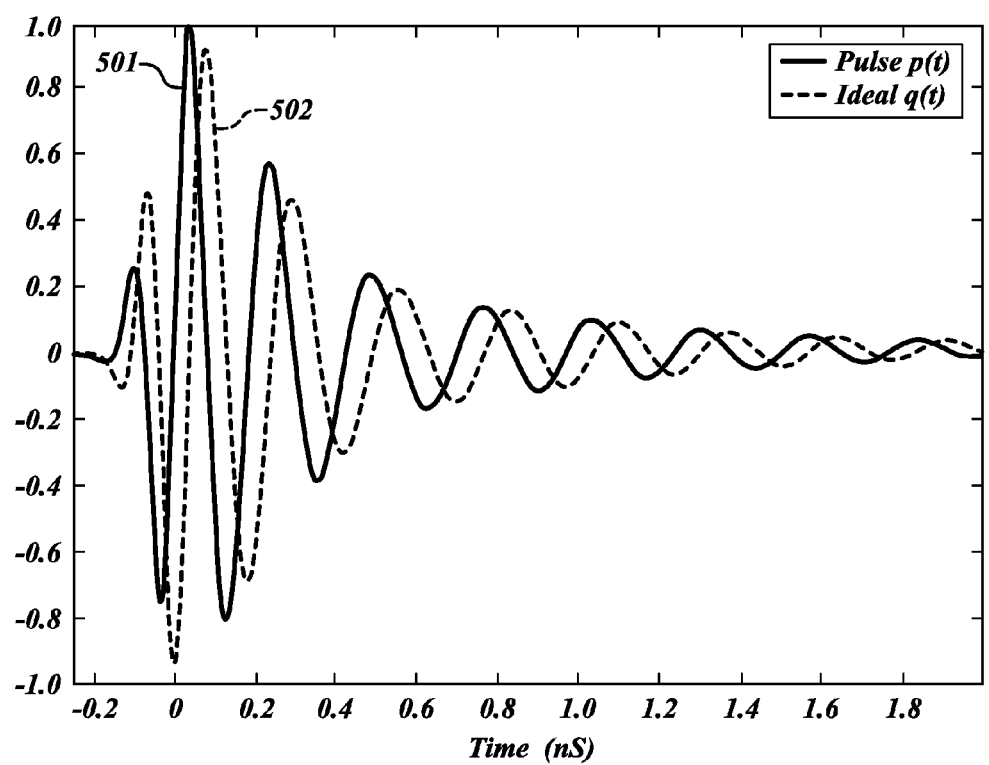
FIG. 5 illustrates quadrature signal q(t) (waveform 502), which is the Hilbert Transform of UWB signal p(t) (waveform 501).
Figure 6:
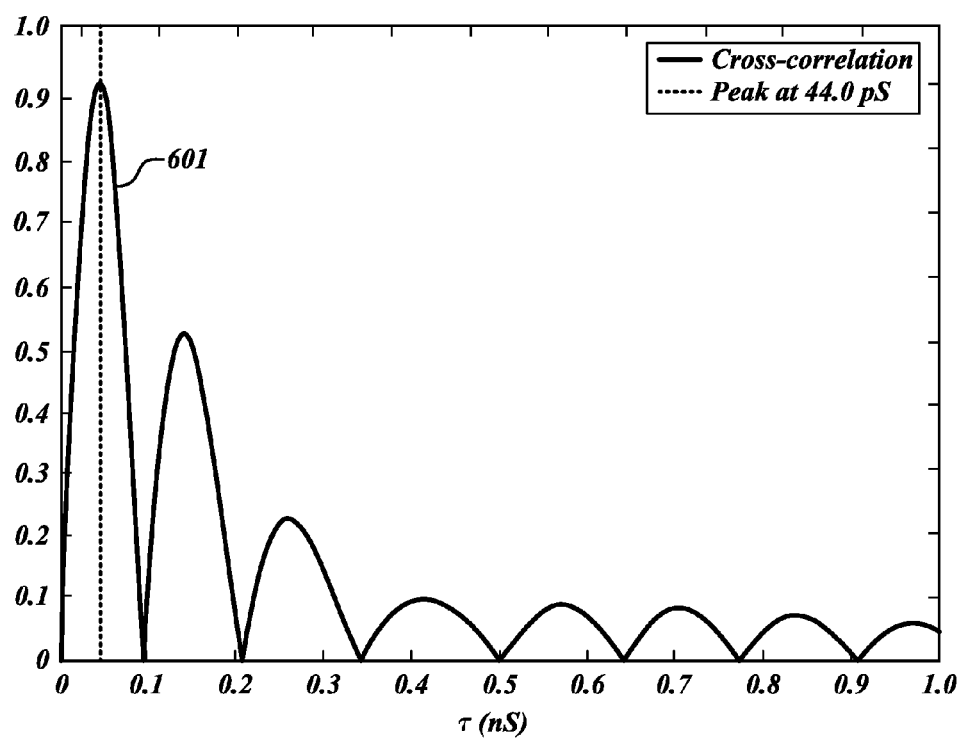
FIG. 6 shows the magnitude of the cross-correlation function between signals q(t) and p(t) of FIG. 5.
Figure 7:
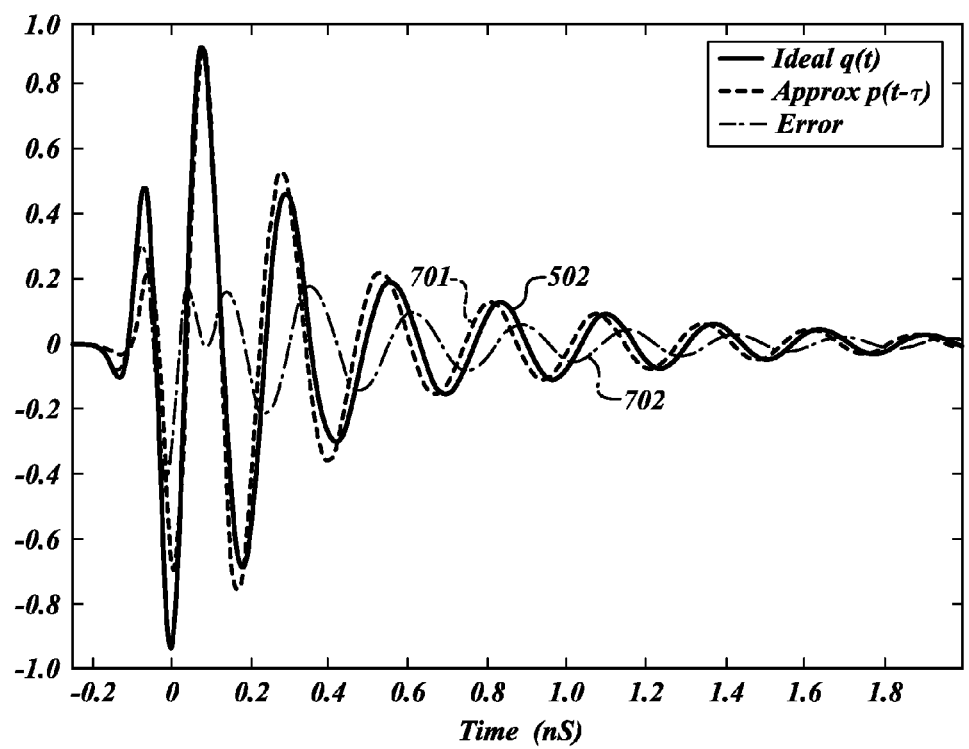
FIG. 7 shows that the total squared error between quadrature signal q(t) (waveform 502 of FIG. 5) and its approximation p(t−τ) (waveform 701) is −8.6 dB, as illustrated by error waveform 702.

According to the cross-correlation procedure, as illustrated in FIG. 5, quadrature signal $q(t)$ (waveform 502) is first obtained from UWB signal $p(t)$ (waveform 501) as its Hilbert transform using conventional techniques. FIG. 6 shows waveform 601, which is the magnitude of the cross-correlation function of signals $q(t)$ and $p(t)$ of FIG. 5. From waveform 601, the corresponding value for $\tau$ can be selected to be $\tau$=44 pS. In this example, FIG. 7 shows the total squared error between quadrature signal q(t) (waveform 502) and approximate quadrature signal $\hat{q}(t)=p(t-\tau)$ (waveform 701) is −8.6 dB, as illustrated by waveform 702.

Auto-Correlation Procedure

Alternatively, the value of $\tau$ can be obtained by a "auto-correlation procedure" that maximizes the orthogonality between approximation $\hat{q}(t)=p(t-\tau)$ of quadrature signal q(t) and in-phase signal p(t). From the perspective of receiver performance optimization, the auto-correlation procedure is expected to provide better performance than the cross-correlation procedure, in such application as maximizing the orthogonality between the portions of the QAM signal y(t) carrying the symbol streams $a_n$ and $b_n$. For example, the orthogonality error between quadrature signal q(t) and in-phase signal p(t) is −10.7 dB. Both of these error measures are higher than is desirable for communication systems intended to achieve a low BER.

Under the auto-correlation procedure, the value of $\tau$ is determined by minimizing the degree of correlation between signal p(t) and approximate quadrature signal $\hat{q}(t)=p(t-\tau)$. Here, the value of $\tau$ is selected to minimize the magnitude of the auto-correlation function of in-phase signal p(t), given by:

$$\int p(t)(t-\tau)dt$$

Figure 8:
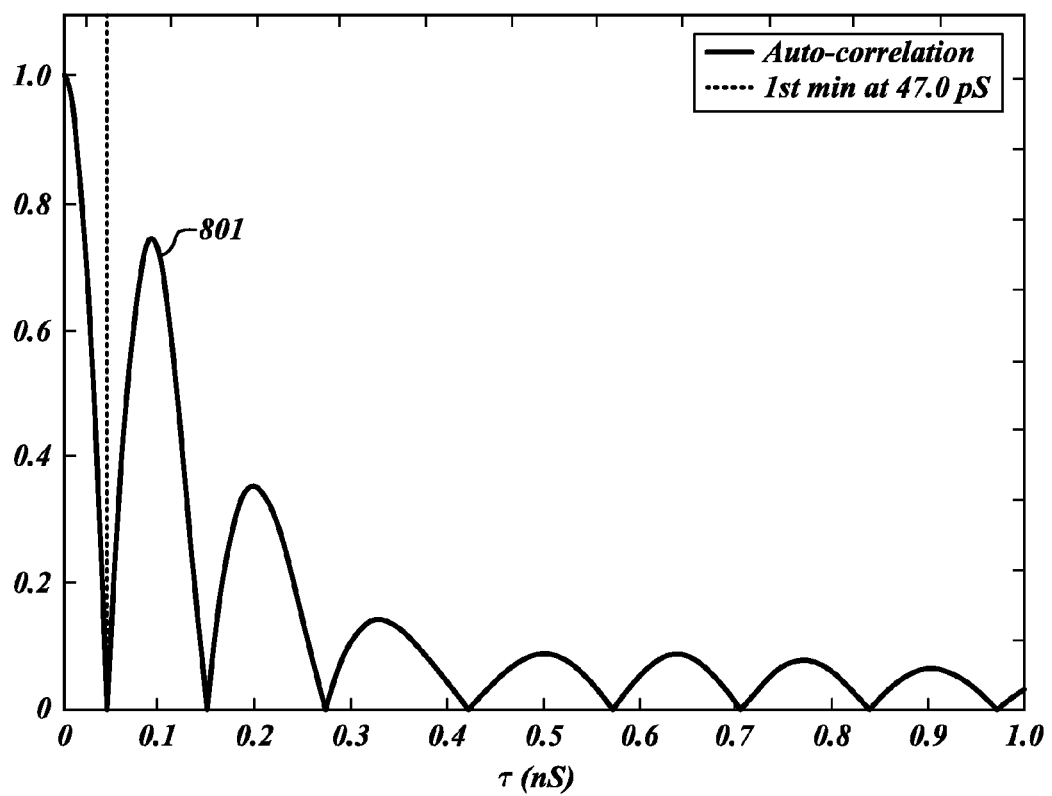
FIG. 8 shows auto-correlation function 801 of signal p(t).
Figure 9:
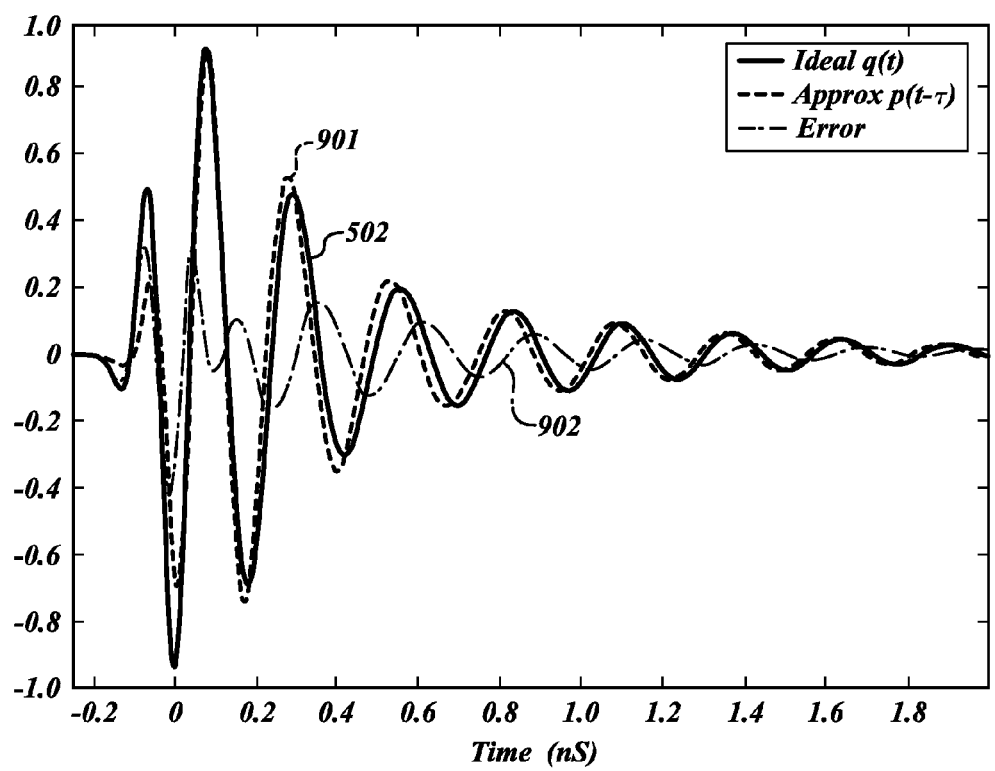
FIG. 9 shows the value for τ slightly increasing the total squared error (waveform 902) between the quadrature signal q(t) (waveform 502 of FIG. 5) and approximation p(t−τ) (waveform 901), which is derived from waveform 801 of FIG. 8 to −8.3 dB.

According to the auto-correlation procedure, FIG. 8 shows auto-correlation function 801 of in-phase signal p(t). From FIG. 8 the value for $\tau$ is selected to be the smallest positive value for $\tau$ at which a null exists (i.e., in this example, the value for $\tau$ is 47 pS). In this example, as seen from FIG. 9, the value for $\tau$ slightly increases the total squared error (waveform 902) between the quadrature signal q(t) (waveform 502 of FIG. 5) and approximate quadrature signal $\hat{q}(t)=p(t-\tau)$ (waveform 901) to −8.3 dB. At the same time, however, the auto-correlation procedure greatly reduces the orthogonality error between approximate quadrature signal $p(t-\tau)$ and in-phase signal p(t) to −34 dB. Such a small error can be ignored in the presence of multipath and other practical system imperfections, and suggests that a QAM system using approximate quadrature signal $\hat{q}(t)=p(t-\tau)$ to construct QAM signal y(t), rather than quadrature signal q(t), should achieve a spectral efficiency and a BER performance that are very close to those in a system using quadrature signal q(t).

Of course, one skilled in the art of communication system design would appreciate that many more modifications and variations to the above cross-correlation and auto-correlation procedures can be used to find the value of $\tau$ within the scope of the present invention. Indeed, the present invention encompasses many other alternative procedures that obtains a suitable value for $\tau$ consistent with the principles discussed above. In a practical implementation, a suitable value of $\tau$ can be selected on the basis of the different trade-offs between transmitter-receiver implementation complexity and the performance (e.g., BER) of the system.

System or Circuit Implementations of the Invention

Figure 10:
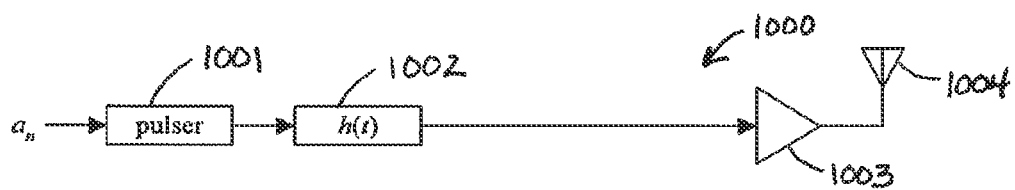
FIG. 10 shows conventional UWB transmitter 1000 using, for example, any one of M-ary PAM, BPSK, or bi-phase monocycles modulations.

FIG. 10 shows conventional UWB transmitter 1000 using, for example, any of M-ary PAM, BPSK, or bi-phase monocycles modulations. As shown in FIG. 10, every T seconds, a next symbol in the sequence $a_{n-1}, a_n, a_{n+1}, \ldots$ is applied to the input terminals of pulser or impulse generator 1001 to produce a very narrow pulse having signed amplitude according to the symbol applied. The output pulse of pulser 1001 may then be filtered by filter 1002 that has an impulse response h(t). The filtered signal of filter 1002 is then applied to final driver amplifier or output buffer 1003 for transmission over antenna 1004. (Of course, transmitter 1000 is provided in FIG. 10 in block diagram form only for illustrative purposes; the functions of blocks 1001-1004 may be implemented in various ways.) For example, filter 1002 and pulser 1001 may be combined, and driver amplifier 1003 can be made optional.

Figure 11:
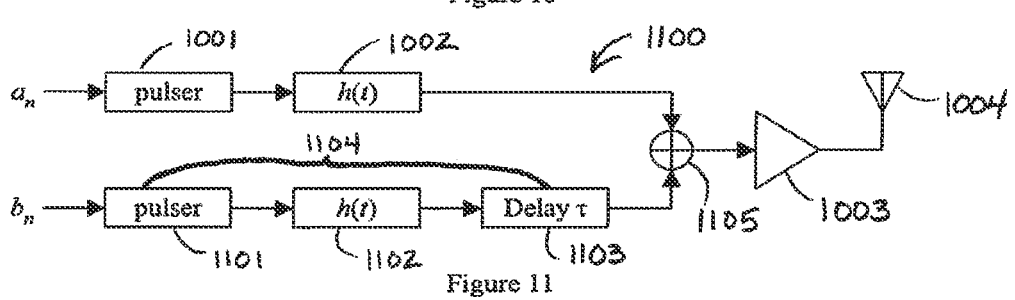
FIG. 11 shows UWB transmitter 1100, which extends conventional UWB transmitter 1000 of FIG. 10 to be capable of M-ary QAM, QPSK, quadri-phase monocycles, and other modulations, in accordance with the present invention.

FIG. 11 shows UWB transmitter 1100, which extends conventional UWB transmitter 1000 of FIG. 10 to be capable of M-ary QAM, QPSK, quadri-phase monocycles, and other modulations, in accordance with the present invention. As shown in FIG. 11, UWB transmitter 1100 includes a first signal path which includes pulser 1001 and filter 1002, similar to the corresponding elements of transmitter 1000 of FIG. 10. According to the present invention, a second signal path 1104, which includes pulser 1101, filter 1102 and delay element 1103, is provided. Pulser 1101 and filter 1102 can be implemented using elements substantially similar to those used to implement pulser 1001 and filter 1002 of FIG. 10. Second signal path 1104 is provided, however, for transmitting symbols sequence $b_{n-1}, b_n, b_{n+1}$ (i.e., the coefficients of the quadrature signal). Although drawn in FIG. 11 as the last element in signal path 1104, delay element 1103 can appear anywhere signal path 1104. The output signal of signal path 1104 is summed at summer 1105 with the output signal of filter 1002, prior to being applied to final driver amplifier or output buffer 1003 for transmission over antenna 1004. The placement of delay element 1103 may be a design decision motivated by implementation considerations. For example, the position of delay element 1103 in UWB transmitter 1100 can be selected if implementing a delay at the radio frequency (RF) stage to take advantage of a short transmission line is deemed preferable.

Figure 12:
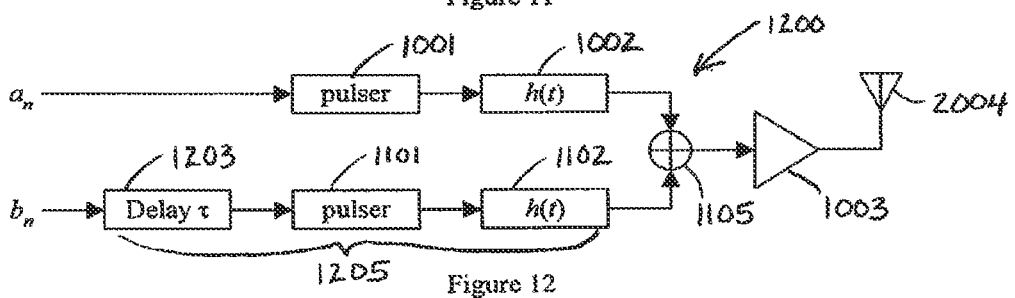
FIG. 12 shows UWB transmitter 1200, in which delay element 1203 is provided ahead of pulser 1101 and filter 1102 in quadrature signal path 1205.

Alternatively, if a digital timing implementation of delay element is preferred, then an alternative embodiment, illustrated by UWB transmitter 1200 of FIG. 12, is preferable. In FIG. 12, delay element 1203 is provided ahead of pulser 1101 and filter 1102 in quadrature signal path 1205.

To select the delay value r, one approach defines the signal p(t) in the in-phase signal path to be that obtained after measuring the entire path including pulser 1001, filter 1002, summer 1105, driver amplifier or output buffer 1003, and antenna 1004. However, if practical considerations disallow such measurement (e.g., if antenna 1004's frequency response cannot be readily measured in the signal path), then either an approximation for the omitted element's frequency response may be substituted, or an adjustment or update to the initial value of delay $\tau$ in the signal paths (e.g., the signal paths of FIGS. 11 and 12) should be provided.

In practice, implementing a delay with high precision may be difficult. Also, it may be desirable to replace the delay with a modified delay that results in an approximate, quadrature pulse $\hat{q}(t)$ that is more highly orthogonal to in-phase signal p(t). According to the present invention, both a highly accurate delay and a capability of delay modification can be achieved, if the delay element is provided in a more general filtering operation.

Figure 13:
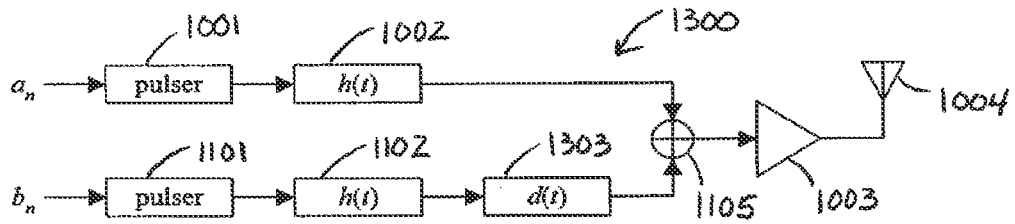
FIG. 13 shows UWB transmitter 1300, which is a generalized representation of a class of UWB transmitters of the present invention.

In the discussion above, approximate quadrature pulse $\hat{q}(t)$ is provided by $\hat{q}(t)=p(t-\tau)$. According to another embodiment of the present invention, approximate quadrature pulse $\hat{q}(t)$ can alternatively be provided by $\hat{q}(t)=p(t)*d(t)$ where, as discussed above, '*' denotes a convolution of in-phase signal p(t) with delay impulse response d(t). Impulse response d(t) is the actual delay function or modified delay implemented in the delay element, such as delay element 1303, shown in FIG. 13. FIG. 13 shows UWB transmitter 1300, which is a generalized representation of a class of UWB transmitters of the present invention. UWB transmitter 1100 of FIG. 11, for example, is a member of the class of UWB transmitters represented by UWB transmitter 1300, since delay element 1103 of UWB transmitter 1100 has an impulse response $\delta(t-\tau)$, where $\delta(t)$ is the Dirac delta impulse function.

One approximate implementation of delay $d(t)=\delta(t-\tau)$ can be achieved using a transmission line. In practice, the transmission line's impulse response may differ from $d(t)=\delta(t-\tau)$ because its group delay may vary over the frequency band of interest, for example. Another approximate implementation may be achieved, for example, using a lumped-element passive filter (e.g., resistors, capacitors, inductors), alone or in conjunction with a transmission line. In such an implementation, the group delay in the band of interest approximately equals τ. Of course, other approximate implementations of $d(t)=\delta(t-\tau)$ exist and are within the scope of the present invention.

The additional degrees of freedom introduced by using the more general filtering function d(t) not only accommodates practical design constraints, as described above, but may also improve the orthogonality between approximate quadrature signal $\hat{q}(t)$ and in-phase signal p(t), or to formulate approximate quadrature signal $\hat{q}(t)$ to better approximate signal q(t). In general, when the implementation allows control over the phase response (or equivalently, the group delay) of filter impulse response d(t), then impulse response d(t) can be chosen to minimize the normalized squared error between approximate quadrature signal $\hat{q}(t)$ and quadrature signal q(t), or to minimize the degree of correlation between approximate quadrature signal $\hat{q}(t)$ and in-phase signal p(t).

Recognizing that, because the Hilbert transform of signal p(t) can be selected as quadrature signal q(t) (which is also a filtered version of signal p(t)), a properly chosen filter impulse response d(t) can provide an approximate quadrature signal $\hat{q}(t)$ that better approximates the ideal quadrature signal q(t). In other words, over the band of interest, the ideal impulse response d(t) (i.e., without regard to implementation considerations) is provided by the Hilbert transform filter $$\frac{1}{\pi t}.$$

In practice, due to implementation constraints, impulse response d(t) can do no more than approximate the Hilbert transform filter. Nevertheless, such an approximation is acceptable for use in the present invention and may result in an implementation of approximate quadrature signal $\hat{q}(t)$ that improves overall system performance. Similarly, impulse response d(t) may be chosen to approximate $d(t)=\delta(t-\tau)$ with the design objective of improving overall system performance.

To receive the signals produced by the present invention, such as QAM signals, conventional matched-filtering techniques can be used. Application of matched-filtering techniques results in a number of receiver structures, such as those shown in FIGS. 14-17.

Figure 14:
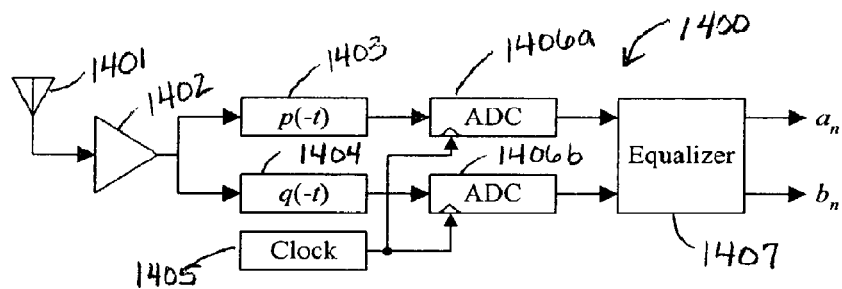
FIG. 14 shows carrier-less QAM receiver 1400 based on matched filtering for a QAM signal that uses true in-phase and quadrature pulses.

FIG. 14 shows carrier-less QAM receiver 1400 based on matched filtering for an ideal QAM signal that uses true in-phase and quadrature pulses. As shown in FIG. 14, the signal received at antenna 1401 and amplified by amplifier 1402 is filtered by filters 1403 and 1404 having impulse responses p(−t) and q(−t), respectively matched to the in-phase and quadrature signals used for transmission. The resulting signals are then sampled in analog-to-digital converters 1406a and 1406b, and compensated in equalizer 1407 to recover the in-phase and quadrature coefficients $a_n$ and $b_n$ respectively.

Figure 15:
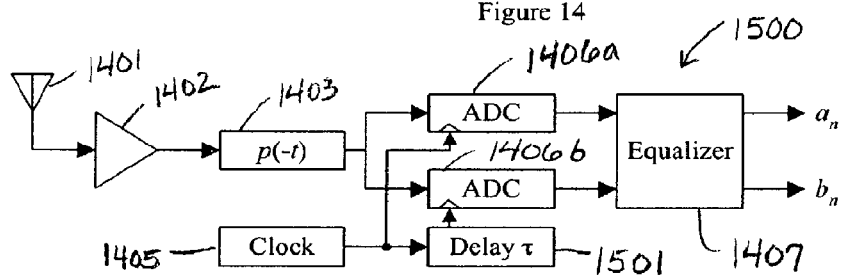
FIG. 15 shows matched-filter QAM receiver 1500 in which a delay τ, corresponding the delay τ used in the transmitter to approximate the quadrature signal q(t), is applied to the sampling clock of analog-to-digital converter 1406b in the quadrature arm.

FIG. 15 shows matched-filter QAM receiver 1500 in which a delay τ, corresponding the delay τ used in the transmitter to approximate the quadrature signal q(t), is applied to the sampling clock of analog-to-digital converter 1406b in the quadrature arm. As shown in FIG. 15, the signal received at antenna 1401 and amplified by amplifier 1402 is first filtered by filter 1403 having impulse response p(−t). The matched quadrature filter function p(−t+τ) is implemented by delaying the clock signal for analog-to-digital converter 1406b by the value of τ in delay element 1501. The output signals from analog-to-digital converters 1406a and 1406b are compensated in equalizer 1407 to recover the in-phase and quadrature coefficients $a_n$ and $b_n$ respectively.

Figure 16:
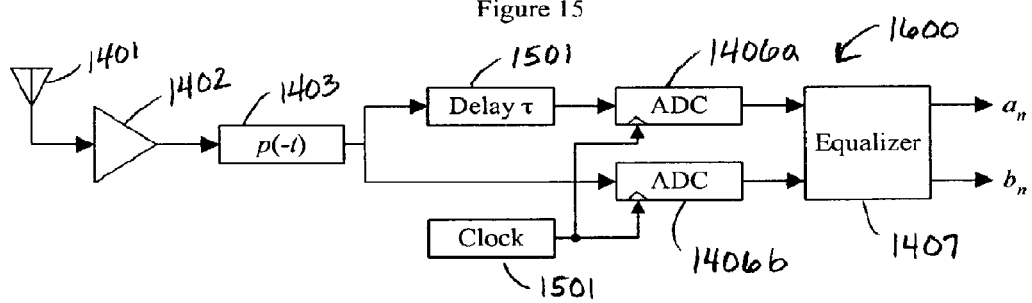
FIG. 16 shows matched-filter QAM receiver 1600 in which the delay τ is applied to the received signal in the in-phase arm.

FIG. 16 shows matched-filter QAM receiver 1600 in which the delay τ is applied to the received signal in the in-phase arm, which is equivalent advancing the received signal in the quadrature arm by τ). While the operation of matched-filter QAM receiver 1600 is substantially the same as that of matched-filter QAM receiver 1400 of FIG. 14, matched-filter QAM receiver 1400 of FIG. 14 is the preferred receiver implementation because a phase advance is non-causal and cannot be directly implemented.

Figure 17:
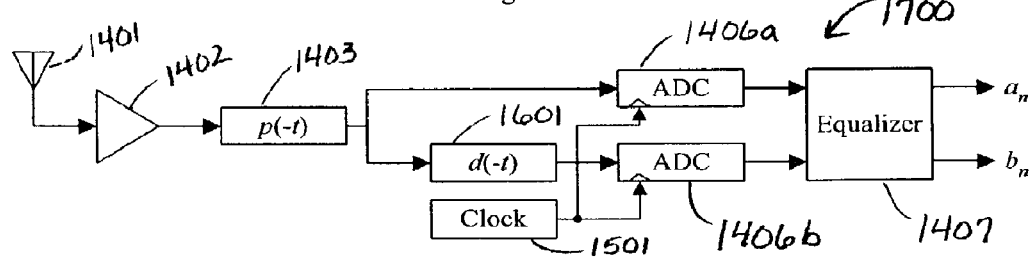
FIG. 17 shows matched-filter QAM receiver 1700 in which the delay used for the quadrature arm is implemented by a more general filter 1601 having an impulse response d(−t) that is matched to the delay filter having impulse response d(t) (e.g., delay filter 1303 of FIG. 13).

FIG. 17 shows a matched-filter QAM receiver in which the delay used for the quadrature arm is implemented by a more general filter 1601 having an impulse response d(−t) that is matched to the delay filter having impulse response d(t) (e.g., delay filter 1303 of FIG. 13). As shown in FIG. 17, the signal received at antenna 1401 and amplified by amplifier 1402 is first filtered by filter 1403 having impulse responses p(−t). The matched quadrature filter function q(−t)=p(−t)*d(−t) is implemented by the serial combination of matched filter 103 and delay filter 1601. The output signals from matched filter 1403 and delay filter 1601 are sampled by analog-to-digital converters 1406a and 1406 and compensated in equalizer 1407 to recover the in-phase and quadrature coefficients $a_n$ and $b_n$ respectively.

Receiver structures that use correlation receivers (or hybrids of correlation receivers and matched-filter receivers) can also be implemented within the context of the present invention, as will be apparent to those skilled in the art of communication systems, having consulted to detailed description above.

As is well known in the art of signal processing, a sequence of linear systems that process an input signal can be re-arranged into any order without altering the final output signal. Using this principle in the context of the present invention enables many possible embodiments in addition to those described above.

The present invention is applicable not only to M-ary PAM and M-ary QAM signals, but also to pulse-position-modulation (PPM) signals (e.g., time-hopped impulse radio), and to signals within the continuous phase modulation (CPM) family of signals (although in phase-quadrature representations of CPM signals is known to be problematic, with the exception being Gaussian minimum shift-key (GMSK) and some other modulation schemes that benefit from the Laurent expansion).

The above detailed description is provided to illustrate the embodiments discussed above and is not intended to be limiting of the present invention. Numerous modifications and variations are possible within the scope of the present invention. The present invention is set forth in the following claims.

I claim:
1. A method, comprising:
obtaining, by a transmitter, an in-phase signal;
obtaining, by the transmitter, an approximation of a quadrature signal by applying a delay to the in-phase signal, wherein a value of the delay is selected by using a cross-correlation procedure that increases a magnitude of a cross-correlation function of the quadrature signal and the approximation of the quadrature signal to the in-phase signal; and summing, by the transmitter, the in-phase signal and the approximation of the quadrature signal.

2. The method of claim 1 wherein the cross-correlation procedure that increases the magnitude of the cross-correlation function involves reducing a mean squared error between the quadrature signal and the approximation of the quadrature signal.

3. The method of claim 2 wherein the cross-correlation procedure that increases the magnitude of the cross-correlation function includes the cross-correlation procedure maximizing the magnitude of the cross-correlation function, and wherein said reducing the mean squared error includes minimizing the mean squared error.

4. The method of claim 1 wherein the in-phase signal conforms to Rice's representation.

5. The method of claim 1 wherein the transmitter includes an ultra-wideband (UWB) transmitter.

6. An apparatus, comprising:
a first signal path configured to generate an in-phase signal;
a second signal path configured to generate an approximation of a quadrature signal by application of a delay to the in-phase signal, wherein a value of the delay is selected by using a cross-correlation procedure that increases a magnitude of a cross-correlation function of the quadrature signal and the approximation of the quadrature signal to the in-phase signal; and
a summer coupled to the first and second signal paths and configured to sum the in-phase signal and the approximation of the quadrature signal.

7. The apparatus of claim 6 wherein the cross-correlation procedure that increases the magnitude of the cross-correlation function involves a reduction of a mean squared error between the quadrature signal and the approximation of the quadrature signal.

8. The apparatus of claim 7 wherein the increase of the magnitude of the cross-correlation function includes a maximization of the magnitude of the cross-correlation function, and wherein the reduction of the mean squared error includes a minimization of the mean squared error.

9. The apparatus of claim 6 wherein the in-phase signal conforms to Rice's representation.

10. The apparatus of claim 6 wherein the first and second signal paths are included in a transmitter configured to transmit an output signal of the summer, the output signal including the sum of the in-phase signal and the approximation of the quadrature signal.

11. The apparatus of claim 6 wherein the apparatus includes an ultra-wideband (UWB) apparatus.

12. An apparatus, comprising: a transmitter configured to:
obtain an in-phase signal;
obtain an approximation of a quadrature signal by applying a delay to the in-phase signal, wherein a value of the delay is selected by using a cross-correlation procedure that increases a magnitude of a cross-correlation function of the quadrature signal and the approximation of the quadrature signal to the in-phase signal; and
sum the in-phase signal and the approximation of the quadrature signal.

13. The apparatus of claim 12 wherein the cross-correlation procedure that increases the magnitude of the cross-correlation function involves a reduction of a mean squared error between the quadrature signal and the approximation of the quadrature signal.

14. The apparatus of claim 13 wherein the increase of the magnitude of the cross-correlation function includes a maximization of the magnitude of the cross-correlation function, and wherein the reduction of the mean squared error includes a minimization of the mean squared error.

15. The apparatus of claim 12 wherein the in-phase signal conforms to Rice's representation.

16. The apparatus of claim 12 wherein the transmitter includes a first signal path configured to generate the in-phase signal, a second signal path configured to generate the approximation of the quadrature signal, and a summer configured to sum the in-phase signal and the approximation of the quadrature signal.

17. The apparatus of claim 16 wherein the transmitter is configured to transmit an output signal of the summer, the output signal including the sum of the in-phase signal and the approximation of the quadrature signal.

18. The apparatus of claim 12 wherein the transmitter includes an ultra-wideband (UWB) transmitter.

19. The apparatus of claim 12 wherein the transmitter includes a delay element configured to apply the delay to the in-phase signal, the delay element including a passive filter.

* * * * *